United States Patent [19]

Ozawa

[11] Patent Number: 4,626,712

[45] Date of Patent: Dec. 2, 1986

[54] HIGH SPEED MOS INPUT CIRCUIT WITH PRECISION INPUT-OUTPUT CHARACTERISTICS

[75] Inventor: Takashi Ozawa, Tokyo, Japan

[73] Assignee: NEC Corporation, Tokyo, Japan

[21] Appl. No.: 590,619

[22] Filed: Mar. 19, 1984

[30] Foreign Application Priority Data

Mar. 18, 1983 [JP] Japan ................... 58-45474

[51] Int. Cl.[4] ........................................ H03K 19/003
[52] U.S. Cl. .................................. 307/475; 307/443;
307/448; 307/451; 307/303; 307/577; 307/579;
307/304
[58] Field of Search ............... 307/443, 448, 450–451,
307/475, 496, 497, 500, 501, 362, 363, 571, 572,
577, 579, 584, 585, 264, 303–304; 357/23.3, 41

[56] References Cited

U.S. PATENT DOCUMENTS

| 4,229,756 | 10/1980 | Sato et al. ............... 357/23.3 X |
| 4,402,761 | 9/1983 | Feist ....................... 357/23.3 X |
| 4,406,957 | 9/1983 | Atherton ................. 307/475 |
| 4,437,025 | 3/1984 | Liu et al. ................. 307/475 |
| 4,479,067 | 10/1984 | Fujita ..................... 307/475 |
| 4,501,978 | 2/1985 | Gentile et al. .......... 307/475 |
| 4,532,436 | 7/1985 | Bismarck ................ 307/475 X |

FOREIGN PATENT DOCUMENTS 0071975 6/1981 Japan ..................... 357/41

OTHER PUBLICATIONS

Dingwall, "TTL-to-CMOS Buffer Circuit", RCA Technical Notes, Princeton, NJ, TN No. 1114, Jun. 1975, 3 pages.

Primary Examiner—Stanley D. Miller
Assistant Examiner—D. R. Hudspeth
Attorney, Agent, or Firm—Sughrue, Mion, Zinn, Macpeak, and Seas

[57] ABSTRACT

An input circuit for an integrated circuit structure achieves high speed operation without being affected by deviation or offset caused by the manufacturing process. The input circuit is of the type having a first inverter receiving an input signal and a second inverter receiving an output signal of the first inverter. The channel length of a driver MISFET of the first inverter is larger than that of a driver MISFET of the second inverter.

11 Claims, 7 Drawing Figures

HIGH SPEED MOS INPUT CIRCUIT WITH PRECISION INPUT-OUTPUT CHARACTERISTICS

FIELD OF THE INVENTION

The present invention relates to an input circuit, and more particularly to an input circuit for an integrated circuit structure composed of insulated-gate field effect transistors (MISFETs).

Input circuits such as inverters and inverter-buffers are used to receive input signals from the outside and to generate internal signals which are applied to internal circuits of an integrated circuit structure. An inverter is a basic and the simplest example of such an input circuit. As is well known, an inverter is formed by a load transistor and a drive transistor connected in series between power voltages. In many cases two or more inverters are connected in cascade to form an input circuit. In integrated circuits which employ the TTL level interface standard, it is generally defined that the minimum value of a high logic level is 2 V while the maximum value of a low logic level is 0.8 V. Therefore, it is necessary that an inverter receiving an input signal fulfill the above standard. Namely, when the level of the input signal is 2 V or more, the inverter receiving the input signal must generate a low logic level output. When the level of the input signal is 0.8 V or less, the inverter must generate a high logic level output.

In general, the input-output characteristic of an interver is determined by the conductance ratio of the load transistor and the drive transistor. The conductance of the load transistor and the drive transistor is determined as a function of channel length (effective gate length) L, channel width W, and threshold value $V_T$ of the respective transistors. Therefore, it is necessary to fabricate the respective transistors with desired dimensions and patterns.

Recently, in order to increase the scale of integration of circuit elements in integrated circuits and to achieve high speed operations, designers have been shortening the channel length L of MISFETs. However, there have been limitations in manufacturing semiconductor elements accurately, and some structural deviations in dimensions and patterns of the circuit element, such as FETs, must be taken into account. Shortened channel lengths are easily affected by the deviations in dimensions and/or patterns. Namely, the absolute amount of deviations ($\Delta$ L) in dimensions and patterns is relatively constant and independent of channel length. Hence the ratio of $\Delta$ L/L becomes more significant the shorter the length L.

Therefore, it has become difficult to fabricate accurately MISFETs having shortened channel lengths, and consequently it has also been difficult to fabricate an input circuit operable at a high speed and having a desired input-output characteristic.

SUMMARY OF THE INVENTION

It is one object of the present invention to provide an input circuit which can operate at a high speed without being affected by deviation in manufacturing.

It is another object of the present invention to provide an input circuit having a desired input-output characteristic.

An input circuit according to the present invention comprises a first series circuit of MISFETs receiving an input signal from the outside and a second series circuit of MISFETs receiving a signal from the first series circuit. The channel length of a driver transistor of the first series circuit is set larger than the channel length of a driver transistor of the second series circuit.

According to the present invention, the driver transistor of the first series circuit has a large channel length and is therefore less likely to be affected by any deviation in manufacturing. Therefore, the first series circuit can have the desired input-output characteristic with respect to the input signal. The channel length of the driver transistor of the second series circuit is made shorter and hence the second series circuit can amplify the output signal of the first series circuit at a high speed, without being affected by the input signal from the outside.

Therefore, according to the present invention, the input circuit which can operate stably and at a high speed can be obtained.

A typical structure for each of the first and second series circuits is an inverter formed by a load MISFET and a driver MISFET connected in series between power voltages. The channel length of the driver transistor of the first series circuit is favorably 1.2 micron to 4 microns and that of the driver transistor of the second series circuit is favorably 1 micron to 2 microns. The difference in channel length between the two transistors is favorably 0.2 micron to 2 microns.

DETAILED DESCRIPTION OF THE INVENTION

In the following explanation, N-channel MISFETs and a positive logic system, in which a high level ($V_{DD}$) is considered as logic "1" and a low level (GND) is considered as logic "0', are employed.

Figure 1:
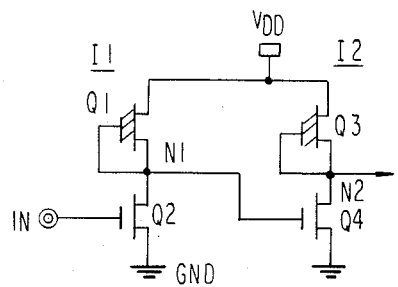
FIG. 1 is a circuit diagram showing an input circuit.

With reference to FIG. 1, a general structure of an input circuit will be described.

A depletion type load MISFET Q1 and an enhancement type driver MISFET Q2 connected in series form an input stage inverter circuit $I_1$, which is coupled to an input terminal IN for receiving an input signal. A depletion type MISFET Q3 and an enhancement type MISFET Q4 connected in series form a second stage inverter circuit $I_2$, which receives an output signal from the input stage inverter circuit $I_1$.

In this input circuit, when the input signal IN is at a high level, MISFET Q2 becomes conducting to make the output ($N_1$) a low level, and therefore, the MISFET Q4 becomes non-conducting so that a high level output is generated at output node $N_2$ of inverter circuit $I_2$. When the input signal IN is at a low level, MISFET Q2 becomes non-conducting to set the node $N_1$ at a high level, and therefore the MISFET Q4 becomes conducting to set the output node $N_2$ at a low level.

In the case where TTL level interface is generally required, the input circuit must operate in such a manner that it classifies an input signal of 2 V or more as a high level signal and classifies an input signal of 0.8 V or less as a low level signal. The channel lengths, channel widths and threshold voltages of the MISFETs employed in the input circuit must be designed to fulfill the above requirement.

Heretofore, the channel lengths of the MISFET $Q_2$ and that of the MISFET $Q_4$ have been designed with the same dimensions. A practical example of the layout of an input circuit according to the prior art will be explained with reference to FIG. 2.

Figure 2:
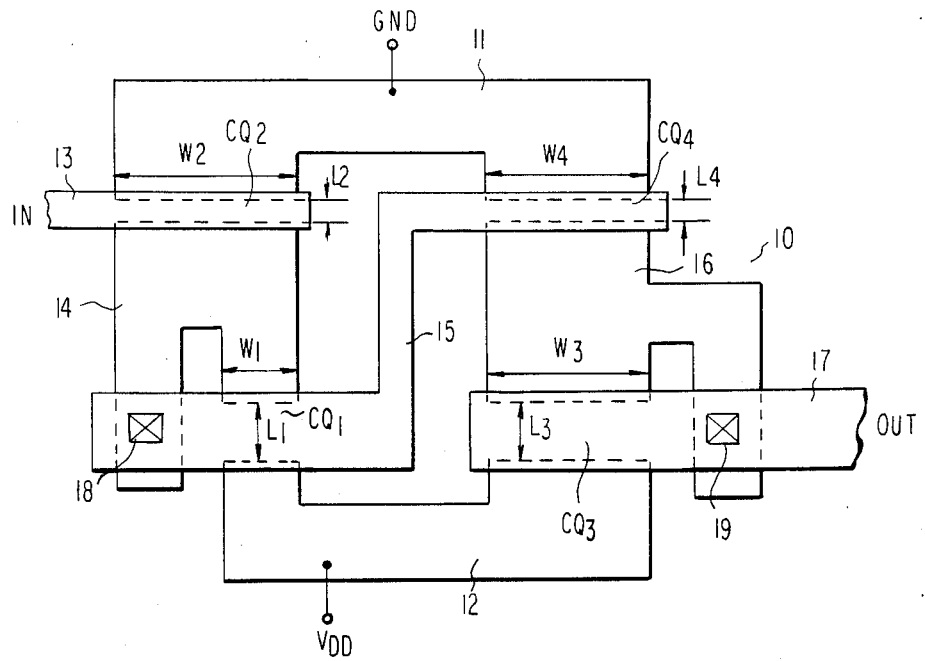
FIG. 2 is a plan view showing a layout of an input circuit according to the prior art.

As shown in FIG. 2, the drains of MISFETs $Q_1$ and $Q_3$ in FIG. 1 are formed by an N type diffusion region 12 formed in a P type semiconductor substrate 10. An N type region 14 forms a commonly connected source of MISFET $Q_1$ and drain of MISFET $Q_2$. An N type region 16 forms a commonly connected source of MISFET $Q_3$ and drain of MISFET $Q_4$. An N type region 11 acts as the common source of MISFETs $Q_2$ and $Q_4$ and is supplied with a ground potential GND.

The channel region $CQ_2$ defined by a channel length $L_2$ and a channel width $W_2$ of the MISFET $Q_2$ is located between regions 11 and 14 and is covered by a wiring 13 formed of polycrystalline silicon. The wiring 13 is supplied with the input signal. A channel region $CQ_1$ defined by a channel length $L_1$ and a width $W_1$ of the MISFET $Q_1$, is located between regions 14 and 12, and a channel region $CQ_4$ defined by a channel length $L_4$ and a channel width $W_4$ of the MISFET $Q_4$ is located between regions 11 and 16. The channel region $CQ_1$ and $CQ_4$ are covered by a wiring 15 made of polycrystalline silicon. The wiring 15 also functions as node $N_1$ at connection point 18. A wiring 17 made of a polycrystalline silicon covers a channel region $CQ_3$ defined by a channel length $L_3$ and a channel width $W_3$ of the MISFET $Q_3$ and functions as a gate of the MISFET $Q_3$ and a wiring for deriving an output signal from the region 16($N_2$). Portions of the wirings above the respective channel regions function as gate electrodes for the respective MISFETs.

According to the prior art, the channel length $L_2$ of MISFET $Q_2$ and channel length $L_4$ of the MISFET $Q_4$ are designed at the same short value, e.g., 2 micron. The channel width $W_2$ of MISFET $Q_2$ is set larger than the chanel width $W_4$ of MISFET $Q_4$ so that MISFET $Q_2$ has a larger amplification factor than does MISFET $Q_4$. Since the MISFETs $Q_1$ and $Q_3$ function as load elements, their conductances are set at relatively small values. Therefore, channel lengths $L_1$ and $L_3$ of MISFETs $Q_1$ and $Q_3$ are set at large values (e.g., 6 microns).

Since the channel length $L_2$ of MISFET $Q_2$ is very small, a deviation $\Delta L$ in the channel length from a designed value more easily affects the electrical characteristics of MISFET $Q_2$. Therefore, the input-output characteristics of the inverter $I_1$ is inevitably adversely affected by deviations due to the manufacturing process, and far from desirable characteristics result.

Figure 3:
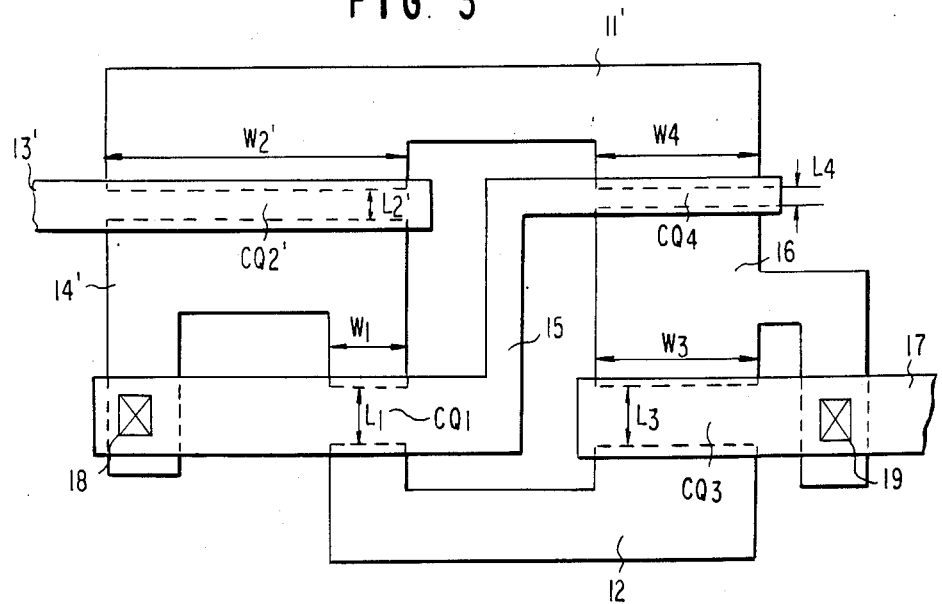
FIG. 3 is a plan view showing a layout of an input circuit according to the present invention.

With reference to FIG. 3, an input circuit according to one embodiment of the present invention will be described.

In FIG. 3, portions corresponding to those in FIG. 2 are designated by the same reference numerals.

In this embodiment, the significant feature resides in that the channel length $L_2'$ of the MISFET $Q_2'$ is made larger than the channel length $L_4$ of the MISFET $Q_4$. For example the channel length $L_4$ of MISFET $Q_4$ is designed at 2 microns, while the channel length $L_2'$ of MISFET $Q_2'$ is designed at 3 microns. The channel width $W_2'$ of MISFET $Q_2'$ is designed at 30 microns, a value larger than the channel width $W_2$ of the MISFET $Q_2$ of FIG. 2 according to the prior art. Thus, a predetermined ratio of $W_2'/L_2'$ is provided to the MISFET $Q_2'$ of the present invention to obtain a predetermined conductance. In correspondence to the enlarged channel length $L_2'$ of MISFET $Q_2'$, a wiring 13' formed of a polycrystalline silicon has a width of 5 microns, a value sufficient to cover the channel region $CQ_2'$ of MISFET $Q_2'$. Other portions relating to the MISFETs $Q_1$, $Q_3$ and $Q_4$ are formed in the same patterns as those in FIG. 2. Contacts 18 and 19 are provided to electrically connect the region 14' to the wiring 15 and the region 16 to the wiring 17, respectively. Each of the channel widths $W_3$ and $W_4$ of MISFETs $Q_3$ and $Q_4$ is 20 microns. Each of the channel lengths $L_1$ and $L_3$ of MISFETs $Q_1$ and $Q_3$ is designed at 6 microns.

Figure 4A:
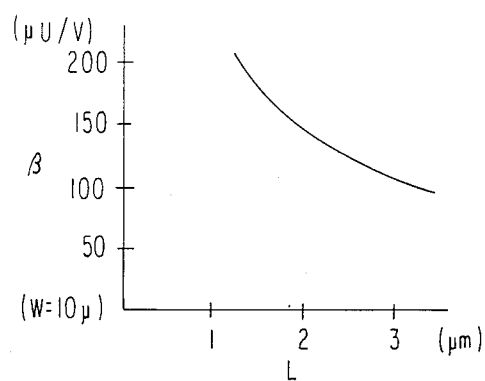
FIG. 4(A) is a chart showing the relation between conductance and channel length in a MISFET.
Figure 4B:
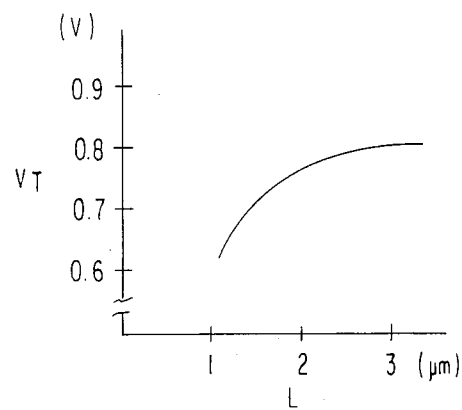
FIG. 4(B) is a chart showing the relation between threshold voltage and channel length in a MISFET.

The relation between the conductance $\beta$ and the channel length L of a MISFET, and the relation between the threshold voltage $V_T$ and the channel length L of a MISFET are shown in FIG. 4(A) and FIG. 4(B), respectively.

As is obvious from the figures, in the region where the channel length is short, e.g., less than 2 microns, the ratio of change in the conductance $\beta$ with respect to change in the channel length L is large, and the ratio of change in the threshold voltage $V_T$ with respect to change in the channel length L is also large. In the region where the channel length is 2 microns or more, the ratio of change in the conductance $\beta$ and the ratio of change in the threshold voltage $V_T$ with respect to the change in the channel length L are small.

In the input circuit shown in FIG. 3, it will be assumed that the value of the deviation $\Delta L$ of the channel lengths of the respective MISFETs $Q_1$, $Q_2'$, $Q_3$ and $Q_4$ is $-0.4$ microns. The channel lengths $L_2'$ and $L_4$ of MISFETs $Q_2'$ and $Q_4$ become 2.6 microns and 1.6 microns, respectively. Therefore, the amount of change in the conductance $\beta$ and the amount of the change in the threshold voltage $V_T$ of MISFET $Q_2'$ are 12 $\mu\Omega/V$ and 0.01 V, respectively. While the amount of change in the conductance $\beta$ and the amount of change in the threshold voltage $V_T$ of the MISFET $Q_4$ are 30 $\mu\Omega/V$ and 0.05 V, respectively. Changes in the electric characteristics of the MISFETs $Q_1$ and $Q_3$ acting as load elements are negligible because their channel lengths are very large as compared to those of the MISFETs $Q_2'$ and $Q_4$.

Accordingly, the change in the electrical characteristics of MISFET $Q_2'$ can be kept small as compared to that of MISFET $Q_4$, and hence the input-output characteristic of the inverter $I_1$ formed by the MISFETs $Q_1$ and $Q_2'$ is hardly affected by the deviation due to manufacturing, and hence the inverter $I_1$ can discriminate accurately between the binary logic levels of the input signal.

The change in the input-output characteristics of the inverter $I_2$ formed of the MISFETs $Q_2$ and $Q_4$ is relatively large, but the signal applied to the inverter $I_2$ is already amplified and discriminated by the inverter $I_1$. Hence the deviation in the input-output characteristics does not affect the substantial function in the inverter $I_2$. Rather, since the MISFET $Q_4$ has a short channel length, it can operate at high speed because carriers can move the short length of channel at a high speed.

Therefore, an input circuit having an extended margin with respect to the input signal and operable at high speeds can be obtained.

Figure 5:
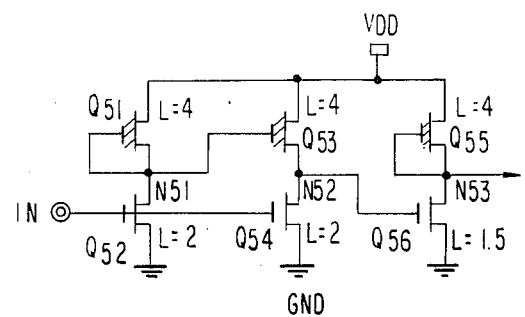
FIG. 5 is a circuit diagram showing a second embodiment of the present invention.

With reference to FIG. 5, an input circuit according to another embodiment of the present invention will be described.

MISFETs $Q_{51}$ to $Q_{54}$ form a buffered type inverter circuit. MISFET $Q_{51}$ is a depletion type transistor and MISFET $Q_{52}$ is an enhancement type transistor, the two forming an input stage inverter. MISFET $Q_{53}$, a depletion type transistor, and MISFET $Q_{52}$, an enhancement type transistor, form a buffer circuit. MISFET $Q_{55}$, a depletion type transistor, and MISFET $Q_{56}$, an enhancement type transistor, form an internal stage inverter. In this input circuit, MISFETs $Q_{52}$ and $Q_{54}$ receive an input signal from the outside at their gates, while MISFET $Q_{56}$ receives a signal from the buffer circuit. According to the present invention, the channel length of MISFET $Q_{56}$ is designed to be 1.5 microns, and channel lengths of MISFET $Q_{52}$ and MISFET $Q_{54}$ are designed to be 2 microns, a value larger than the channel length of MISFET $Q_{56}$. Channel lengths of load element MISFETs $Q_{51}$, $Q_{53}$ and $Q_{55}$ are designed to be 4 microns. As is similar to the previous embodiment, MISFETs $Q_{52}$ and $Q_{54}$ have channel lengths larger than that of MISFET $Q_{56}$, electrical characteristics of the MISFETs $Q_{52}$ and $Q_{54}$ are hardly affected by deviation of the channel lengths caused by the manufacturing process.

Figure 6:
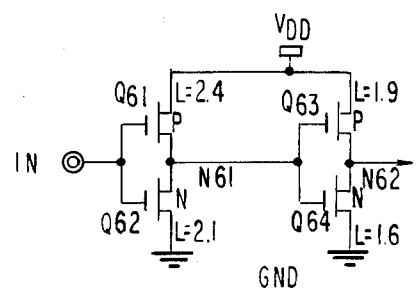
FIG. 6 is a circuit diagram showing a third embodiment of the present invention.

With reference to FIG. 6, an input circuit according to another embodiment of the invention will be described.

The input circuit of this embodiment is formed by P channel MISFETs $Q_{61}$ and $Q_{63}$ and N channel MISFETs $Q_{62}$ and $Q_{64}$.

The MISFETs $Q_{61}$ and $Q_{62}$ form an input stage inverter, which receives an input signal, while MISFETs $Q_{63}$ and $Q_{64}$ form an internal stage inverter, which receives an output signal from an output node $N_{61}$ of the input stage inverter. The channel length of MISFET $Q_{61}$ and the channel length of MISFET $Q_{62}$ are designed to be 2.4 microns and 2.1 microns, respectively. The channel length of MISFET $Q_{63}$ and the channel length of MISFET $Q_{64}$ are designed to be 1.9 microns and 1.6 microns, respectively. Therefore, the channel lengths of MISFETs $Q_{61}$ and $Q_{62}$, which receive the input signal from the outside, are made longer than those of MISFETs $Q_{63}$ and $Q_{64}$, which receive the signal from the input stage inverter.

Similarly to the above embodiments, the input-output characteristics of the input stage inverter ($Q_{61}$ and $Q_{62}$) are hardly affected by deviations in the channel lengths caused by the manufacturing process, while the internal stage inverter ($Q_{63}$ and $Q_{64}$) can operate at a high speed due to the short channel structure of MISFETs $Q_{63}$ and $Q_{64}$.

As described above, according to the present invention, there is provided an input circuit which can operate at a high speed without being affected by deviations caused by the manufacturing process.

I claim:

1. An input circuit for receiving input signals and to be connected to a power supply comprising:
   a first stage series circuit for receiving said input signals, said first stage series circuit including a first driver transistor of insulated-gate field effect type for receiving said input signal and a first load means connected in series across said power supply, said first driver transistor having a channel region defined by a first channel length, said first stage series circuit generating an internal signal from the intermediate junction of said first driver transistor and said first load transistor;
   a second stage series circuit for receiving said internal signal, said second stage series circuit including a second driver transistor of insulated-gate field effect type for receiving said internal signal and a second load means connected in series across said power supply, an output signal being generated from the intermediate junction of said second driver transistors and said second load means;
   said second driver transistor having a channel length shorter than said first channel length wherein said first channel length is 1.2 to 4 microns and said second channel length is 1 to 2 microns, the difference between said first and second channel lengths being 0.2 to 2 microns.

2. The circuit according to claim 1, wherein said first and second driver transistors are of enhancement type transistors and said first and second load means are of depletion type insulated-gate field effect transistors.

3. The circuit according to claim 1, wherein said first stage series circuit is an inverter circuit.

4. The circuit according to claim 1, wherein said internal signal is connected from said first stage series circuit to said second stage series circuit by a wiring formed of polycrystalline silicone.

5. An input circuit for receiving input signals and to be connected to a power supply comprising:
   a first stage series circuit for receiving said input signals, said first stage series circuit including a first driver transistor of insulated-gate field effect type for receiving said input signal and a first load means connected in series across said power supply, said first driver transistor having a channel region defined by a first channel length, said first stage series circuit generating an internal signal from the intermediate junction of said first driver transistor and said first load transistor;
   a second stage series circuit for receiving said internal signal, said second stage series circuit including a second driver transistor of insulated-gate field effect type for receiving said internal signal and a second load means connected in series across said power supply, an output signal being generated from the intermediate junction of said second driver transistor and said second load means;
   said second driver transistor having a channel length shorter than said first channel length wherein said first channel length is not less than 2 microns and said second channel length is not less than 2 microns, the difference between said first and second channel lengths being not less than 0.5 microns.

6. The circuit according to claim 5, wherein said first and said second load transistors have channel regions defined by the same channel length.

7. An input circuit for receiving input signals and to be connected to a power supply comprising:
   a first inventer circuit including a first MISFET having a gate receiving an input signal, a channel region defined by a first value of channel length and a drain from which a first output signal is generated, and a first load element coupled in series across said power supply; and
   a second inverter including a second MISFET having a gate receiving said first output signal, a channel region defined by a second value of channel length smaller than said first value of channel length and a drain from which a second output signal is generated and a second load element coupled in series across said power supply.

wherein said first value of channel length is 1.2 to 4 microns and said second value of channel length is 1 to 2 microns.

8. The invention according to claim 7, wherein said first inverter includes a first load MISFET of a depletion type, and said second inverter includes a second load MISFET of a depletion type.

9. The invention according to claim 7, wherein said first and second load MISFETs have channel regions defined by the same channel length.

10. An input circuit comprising:
an input terminal;
first and second voltage terminals;
a first insulated-gate field effect transistor having a gate coupled to said input terminal and a channel of one conductivity type and a first channel length;
a second insulated-gate field effect transistor having a channel of the opposite conductivity type and a second channel length and a gate coupled to said input terminal, said first and second transistors being connected in series across said first and second voltage terminals, a first output signal being generated from the intermediate junction of said first and second transistors;
a third insulated-gate field effect transistor having a channel of said one conductivity type and a third channel length shorter than said first channel length;
a fourth insulated-gate field effect transistor having a channel of said opposite conductivity type and a fourth channel length shorter than said second channel length, said third and fourth transistors being connected in series across said first and second voltage terminals; and
means for supplying gates of said third and fourth transistors with said first output signal, a second output signal being generated from the intermediate junction of said third and fourth transistors.

11. The circuit according to claim 10, wherein said first and second channel lengths lie within the range of 1.2 to 4 microns and said third and fourth channel lengths lie within the range of 1 to 2 microns, the difference between said first and third channel lengths being 0.2 to 2 microns and the difference between said second and fourth channel lengths being 0.2 to 2 microns.

* * * * *